United States Patent
Blankenship et al.

(10) Patent No.: US 6,831,518 B2
(45) Date of Patent: Dec. 14, 2004

(54) CURRENT STEERING CIRCUIT FOR AMPLIFIER

(75) Inventors: Tim Blankenship, Austin, TX (US); Stephen Bily, Austin, TX (US)

(73) Assignee: Winbond Electronics Corporation (TW)

( * ) Notice: Subject to any disclaimer, the term of this patent is extended or adjusted under 35 U.S.C. 154(b) by 0 days.

(21) Appl. No.: 10/680,566

(22) Filed: Oct. 6, 2003

(65) Prior Publication Data

US 2004/0130395 A1 Jul. 8, 2004

Related U.S. Application Data

(62) Division of application No. 09/972,417, filed on Oct. 4, 2001, now Pat. No. 6,646,481.
(60) Provisional application No. 60/326,078, filed on Sep. 28, 2001.

(51) Int. Cl.[7] .............................. H03F 3/04; H03K 3/00
(52) U.S. Cl. ........................................ 330/288; 327/109
(58) Field of Search ............................ 330/288; 327/109

(56) References Cited

U.S. PATENT DOCUMENTS

| | | | | |
|---|---|---|---|---|
| 4,177,392 A | * | 12/1979 | Haferl | 327/482 |
| 5,627,486 A | * | 5/1997 | Gross | 327/108 |
| 5,841,603 A | * | 11/1998 | Ramalho et al. | 360/68 |
| 6,714,076 B1 | * | 3/2004 | Kalb | 330/255 |

* cited by examiner

*Primary Examiner*—Patricia Nguyen
(74) *Attorney, Agent, or Firm*—Townsend and Townsend and Crew, LLP

(57) ABSTRACT

The present invention provides improved techniques for controlling current flow in an amplifier circuit. Specific embodiments provide steering of analog outputs of digital to analog converters in order to drive columns of an LCD display. Embodiments can provide a full range of voltage output to drive an LCD display without necessitating a full range amplifier configuration. Further, many specific embodiments can be realized in smaller space on an IC chip than in conventional technologies.

9 Claims, 4 Drawing Sheets

CURRENT STEERING CIRCUIT FOR AMPLIFIER

CROSS REFERENCE TO RELATED APPLICATIONS

This application is a divisional of U.S. patent application Ser. No. 09/972,417 filed Oct. 4, 2001 now U.S. Pat. No. 6,646,481, which claims the benefit of U.S. Provisional Patent Application No. 60/326,078 filed Sept. 28, 2001, the disclosures of which are incorporated by reference in their entirety for all purposes.

BACKGROUND OF THE INVENTION

The present invention relates generally to amplifier circuits, and in particular to techniques for controlling current in an amplifier of a column driver.

The liquid crystal display has become ubiquitous and well known, driven in part by popular applications such as laptop personal computers, car navigational displays, and flat panel displays for personal computers. In each of these applications, a column driver circuit enables the operation of each liquid crystal display unit. Liquid crystal displays comprise a plurality of individual picture elements, called pixels, which are uniquely addressable in a row and column arrangement. The column driver circuitry provides driving voltage to the columns of the liquid crystal display. In a typical application, a 13.3 inch XGA liquid crystal display comprises 1024 3-color columns, for a total of 3072 individual columns. In a representative arrangement, these columns are driven by eight 384-column driver chips.

The physics underlying liquid crystal display technology calls for an alternating polarity in the driving voltage. That is to say, if a column of the display is driven at +5 volts for a specific period of time, then this same column is driven at −5 volts during the subsequent time interval. In such an arrangement, the peak to peak voltage is 10 volts, but the sum of the individual driving voltages for any given cycle is 0 volts. Failure to drive a liquid crystal display in such fashion can cause the display to degrade until it becomes no longer usable.

Column driver circuitry components act as intermediaries between the digital format of the electronics that process information and the analog format of the display presenting the results to the user. Accordingly, the column driver circuitry includes a digital to analog converter component that converts the digital signals of the processing unit, bus and memory into an analog signal. However, this analog signal must be capable of driving the liquid crystal display. While some arrangements drive the liquid crystal display columns directly from the digital to analog converter, another technique is to use an amplifier interposed between the converter and the display in order to provide improved driving characteristics for the display.

While certain advantages to conventional approaches are perceived, opportunities for further improvement exist. For example, in many conventional approaches to amplifier design, errors introduced into the output signal of the amplifier are not uniform throughout a substantially large portion of the operation of the circuit. Error characteristics can vary among the different regions of operation of the amplifier. In flat panel display applications, where the amplifier is used is used to buffer a digital analog converter input that drives columns or rows of the flat panel display, these errors can adversely affect image quality because the view can perceive changes in the image when the voltage having the error is switched.

What is needed are improved techniques for controlling current flow in an amplifier circuit.

SUMMARY OF THE INVENTION

The present invention provides improved techniques for controlling current flow in an amplifier circuit. Specific embodiments provide steering of analog outputs of digital to analog converters in order to drive columns of an LCD display. Embodiments can provide a full range of voltage output to drive an LCD display without necessitating a full range amplifier configuration. Further, many specific embodiments can be realized in smaller space on an IC chip than in conventional technologies.

In a representative specific embodiment, the present invention provides a current steering circuit. The current steering circuit comprises a current input node coupled to a first circuit path, the first circuit path drawing current from the current input node during a first mode of operation. A comparator is coupled to the current input node. The comparator draws negligible amount of current from the current input node during the first mode of operation. However, the comparator draws a significant amount of current from the current input node during a second mode of operation so as to divert current from the first circuit path. A current mirror is coupled to the comparator. The current mirror maintains a current flow through a second circuit path during the second mode of operation but not during the first mode of operation.

In some specific embodiments, the current steering circuit further comprises a reference node coupled to the comparator. The reference node provides a reference voltage. A voltage input node can be coupled to the comparator as well. The voltage input node provides an input voltage. The comparator places the current steering circuit in the first mode of operation or the second mode of operation when the input voltage is at a predetermined level relative to the reference voltage.

Specific embodiments of the current steering circuit further comprise a p-type differential amplifier coupled to the first circuit path, and an n-type differential amplifier coupled to the second circuit path. The current steering circuit may further comprise a current source coupled to the current input node in specific embodiments.

The reference voltage can be established by a diode-connected transistor, for example. The voltage input node can include an input terminal of a p-type differential amplifier in specific embodiments.

In a further representative specific embodiment, the present invention provides a current steering circuit. The current steering circuit comprises a current input node coupled to a first circuit path. The first circuit path draws current from the current input node during a first mode of operation. A first transistor is coupled to the current input node. The first transistor draws negligible current from the current input node during the first mode of operation. The first transistor draws current from the current input node during a second mode of operation to divert current from the first circuit path. A second transistor coupled to receive current drawn by the first transistor from the current input node during the second mode of operation is also part of the current steering circuit. The second transistor forms a current mirror with a third transistor that is coupled to a second circuit path. The current steering circuit also includes a reference node providing a reference voltage to a fourth transistor, and a fifth transistor forming a current mirror with the fourth transistor. The fifth transistor supplies a reference current to the first transistor. The amount of the reference current can be related to the reference voltage. The current steering circuit is placed in the first mode of operation or the second mode of operation depending on a voltage level on a voltage input node relative to the reference voltage.

In specific embodiments, the current steering circuit is placed in the first mode of operation when the voltage level on the voltage input node is lower than the reference voltage, and in the second mode of operation when the voltage level on the voltage input node is higher than the reference voltage. In some specific embodiments, the current steering circuit is placed in the first mode of operation when the voltage level on the voltage input node is higher than the reference voltage, and in the second mode of operation when the voltage level on the voltage input node is lower than the reference voltage. In specific embodiments, the first, second, third, fourth, and fifth transistors are MOS transistors.

In a yet further representative specific embodiment, the present invention provides a method for maintaining a substantially constant error in an output voltage sourced by an amplifier that comprises a first circuit and a second circuit. Depending on embodiment, the first and second circuits can be a p-channel amplifier and an n-channel amplifier, respectively, or an n-channel amplifier and a p-channel amplifier, respectively. The method comprises driving an output voltage in a first region of operation in each of the first circuit and the second circuit. Sensing a condition wherein an input voltage, Vin, reaches a reference voltage, Vref, is also part of the method. Further, switching over from a first region of operation to a second region of operation in each of the first circuit and the second circuit is part of the method. The reference voltage, Vref, can be made sufficiently large to provide a substantially constant error within the output voltage.

Numerous benefits are achieved by way of the present invention over conventional techniques. Embodiments can provide a substantially constant error term over a substantially greater region of operation in a voltage output to drive an LCD display. Specific embodiments can provide rail-to-rail voltage range of operation. Embodiments can be configured to switch between regions of operation at input voltages substantially close to the rail. In specific embodiments, a non-constant error region is limited to a portion of the region of operation of a display in which the human eye is not especially sensitive.

These and other benefits are described throughout the present specification. A further understanding of the nature and advantages of the invention herein may be realized by reference to the remaining portions of the specification and the attached drawings.

DESCRIPTION OF THE SPECIFIC EMBODIMENTS

The present invention provides improved techniques for controlling current flow in an amplifier circuit. Specific embodiments provide steering of analog outputs of digital to analog converters in order to drive columns of an LCD display. Embodiments can provide a full range of voltage output to drive an LCD display without necessitating a full range amplifier configuration.

A full range differential amplifier is one capable of providing an output, Vout, spanning a full range of operation, i.e., 0<=Vout<=VDDA. By contrast, non full range amplifiers can provide an output voltage, Vout, within a range of operation spanning from a threshold voltage, VT, to a supply voltage, VDDA, i.e., VT<=Vout<=VDDA, for n-channel configurations, or within a range of operation spanning from 0 to the supply voltage, VDDA, minus the threshold voltage, VT, i.e., 0<=Vout<=VDDA−VT, for p-channel configurations. Full range amplifiers can be realized using a coupling mechanism, such as a field effect transistor, for example, to couple a first architecture, such as a p-channel non full range amplifier, to a second architecture, such as an n-channel non full range amplifier, for example, or an n-channel non full range amplifier to a p-channel non full range amplifier.

This field effect transistor is biased with a reference voltage, Vref, so that as the input voltage, Vin, begins to exceed Vref, current flows from the amplifier circuit of the first architecture to the amplifier circuit of the second architecture. This provides a full range amplifier having three regions of operation, a first region in which one of the circuits, the p-channel, for example, is active (i.e., has current flowing through it), a second region in which both of the circuits are active, and a third region, in which the other circuit, an n-channel in this example, is active. Appropriate selection of Vref can provide operation in the first region over a substantially large portion of an amplifier circuit's range of operation, thereby yielding a substantially constant error term over a substantially greater region of operation in an amplifier's voltage output.

Figure 1:
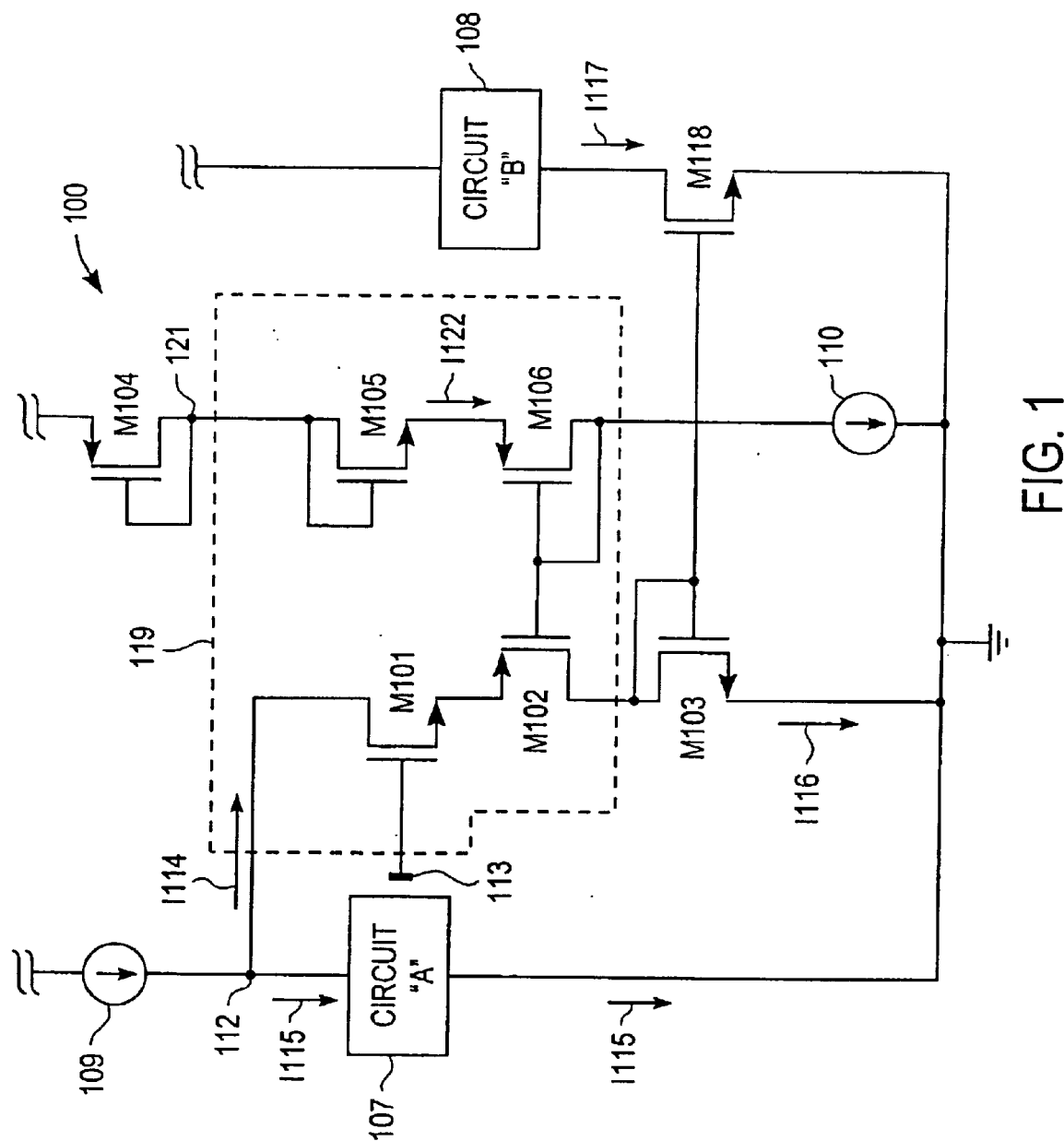
FIG. 1 illustrates a conceptual drawing of a representative current steering circuit in a particular embodiment of the present invention.

Referring to FIG. 1, there is shown a current steering circuit 100 in accordance with an embodiment of the present invention. In this particular embodiment, steering circuit 100 includes metal-oxide semiconductor (MOS) transistors M101–M106. As can be appreciated by those skilled in the art, the current steering circuit of the present invention is not limited to the number and type of transistors used. Steering circuit 100 is coupled to a circuit 107 depicted as circuit "A", and a circuit 108 depicted as circuit "B". Circuits 107 and 108 are not limited to any specific type of circuit. For example, circuit 107 may be the p-type amplifier of a full-range amplifier while circuit 108 may be the corresponding n-type amplifier. Also depicted in FIG. 1, but not necessarily parts of steering circuit 100, are current sources 109 and 110.

In a first mode of operation, steering circuit 100 does not draw a significant amount of current from a node 112. That is, during the first mode of operation, a current I115 is approximately equal to the amount of current supplied by current source 109, while a current I114 is negligible (i.e., very small amount). Consequently, the current through transistor M103 (current I116), which is in series with transistor M101, is also negligible. Because transistor M103 forms a current mirror with a transistor M118, the resulting current through transistor M118 (current I117) is likewise negligible. Thus, relatively speaking, current flows through circuit 107, but not through circuit 108, during the first mode of operation of steering circuit 100.

In a second mode of operation, steering circuit 100 draws a significant amount of current from node 112. In other words, during the second mode of operation, current I114 is approximately equal to the amount of current supplied by current source 109, while current I115 is negligible. This results in the current through transistor M103 and the mirrored-current through transistor M118 to be also approximately equal to the amount of current supplied by current source 109. Thus, relatively speaking, current flows through circuit 108, but not through circuit 107, during the second mode of operation of steering circuit 100.

In this particular embodiment, steering circuit 100 switches between the first and second modes of operation depending on the voltage on a node 113, referred to herein as "Vnode113". When Vnode113 is below a steering threshold level, the VGS (voltage between the gate and source) of transistor M101 is too low to allow transistor M101 to conduct and flow current. In that case, steering circuit 100 will be in the first mode of operation and current will flow through circuit 107, but not through circuit 108. The opposite is true when Vnode113 is above the steering threshold voltage. In that case, the VGS of transistor M101 will be high enough to allow it to conduct, and put steering circuit 100 in the second mode operation where current flows through circuit 108, but not through circuit 107.

Transistors M101, M102, M105, and M106, in effect, form a comparator collectively depicted in FIG. 1 as comparator 119. Comparator 119 compares the voltage on a node 121, herein referred to as "Vnode121", with the voltage on node 113 (Vnode113) and accordingly switches steering circuit 100 between the first and second modes of operation. That is, when Vnode113 is less than Vnode121, the resulting VGS of transistor M101 will be too low to allow current flow, and steering circuit 100 will be in the first mode of operation. Conversely, the VGS of transistor M101 will be high enough to allow current flow, and steering circuit 100 will be in the second mode of operation, when Vnode113 is greater than Vnode121. As can be appreciated, the level and polarity of Vnode113 at which steering circuit 100 switches modes of operation depend on the particular application. For example, with the appropriate routine design change, steering circuit 100 may be placed in the first mode of operation when Vnode113 is greater than Vnode121.

In this particular embodiment, Vnode121 is established by employing a current source 110 to provide current through diode-connected transistor M104. The resulting voltage on the drain of transistor M104, which is Vnode121, also appears on the gate of another diode-connected transistor M105. Thus, Vnode121 sets the voltage on the gate of transistor M105, and controls the amount of current flowing through it (current I122). Transistor M102, which forms a current mirror with transistor M106, also flows an amount of current approximately equal to current I122. The current mirrored by transistor M102 from transistor M106 establishes a voltage level on the source of transistor M101 and the source of transistor M102, thereby influencing the amount of voltage on node 113 needed to make transistors M101 and M102 conduct.

Figure 2:
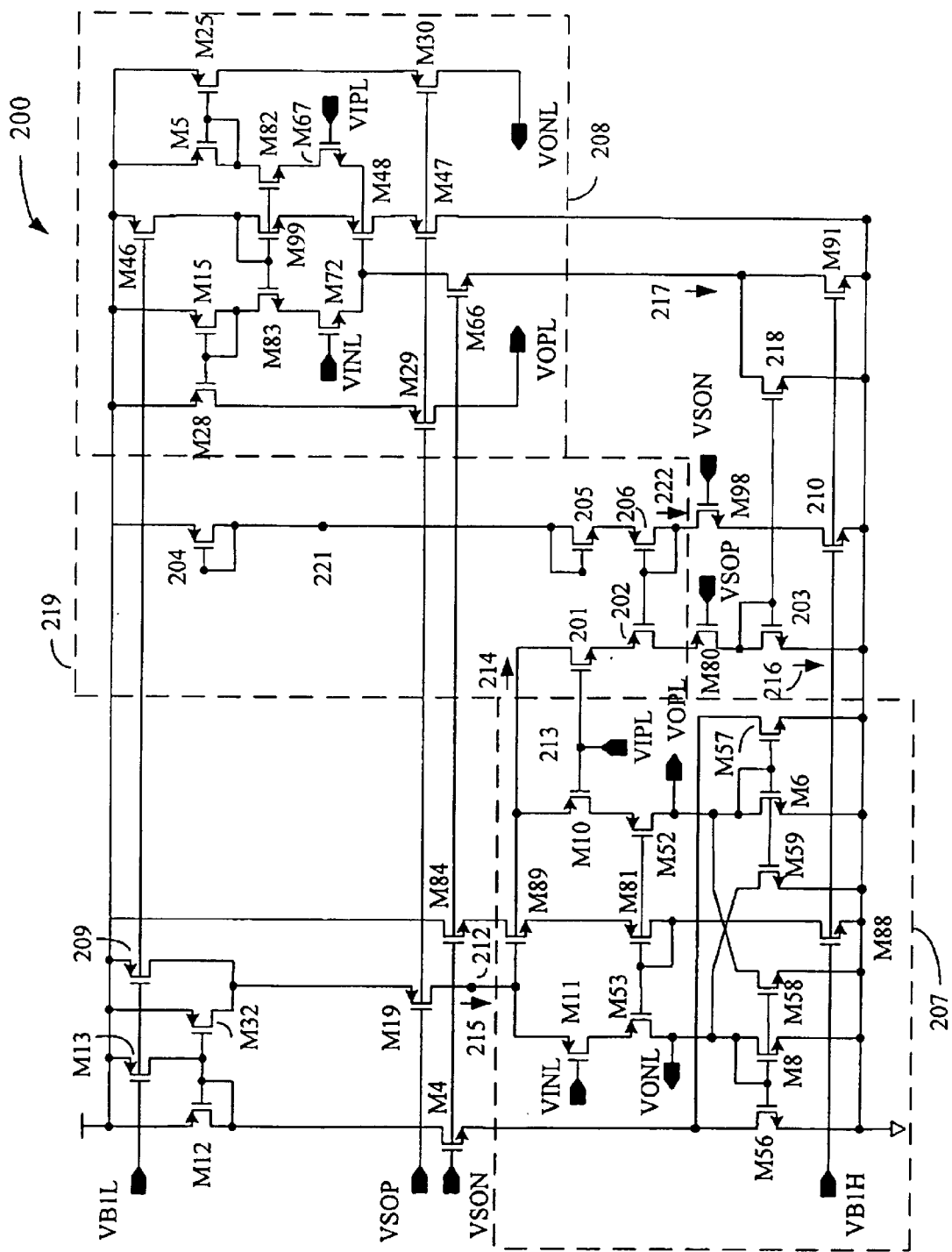
FIG. 2 illustrates a conceptual drawing of a representative current steering circuit in a particular embodiment of the present invention.

FIG. 2 illustrates a representative current steering circuit in accordance with another embodiment of the present invention. In this particular embodiment, steering circuit 200 includes transistors 201–206, which can be metal oxide semiconductor (MOS) transistors or the like. As can be appreciated by those skilled in the art, the current steering circuit of the present invention is not limited to the number and type of transistors used. Steering circuit 200 is coupled to a circuit 207 depicted in FIG. 2 with a dashed line, and a circuit 208, also depicted with a dashed line in FIG. 2. In a specific embodiment, circuits 207 and 208 are a p-type full-range amplifier and a corresponding n-type full-range amplifier, respectively. However, circuits 207 and 208 are not limited to any specific type of circuit. Also depicted in FIG. 2, but not necessarily parts of steering circuit 200, are current sources 209 and 210.

In a first mode of operation, steering circuit 200 does not draw a significant amount of current from a node 212. That is, during the first mode of operation, a current 215 is approximately equal to the amount of current supplied by current source 209, while a current 214 is negligible (i.e., very small amount). Consequently, the current through transistor 203 (current 216), which is in series with transistor 201, is also negligible. Because transistor 203 forms a current mirror with a transistor 218, the resulting current through transistor 218 (current 217) is likewise negligible. Thus, relatively speaking, current flows through circuit 207, but not through circuit 208, during the first mode of operation of steering circuit 200.

In a second mode of operation, steering circuit 200 draws a significant amount of current from node 212. In other words, during the second mode of operation, current 214 is approximately equal to the amount of current supplied by current source 209, while the current flowing through transistor M11 and M10 of the p-channel differential amplifier 207 is negligible. This results in the current through transistor 203 and the mirrored-current through transistor 218 to be also approximately equal to the amount of current supplied by current source 209. Thus, relatively speaking, current flows through circuit 208, but not through circuit 207, during the second mode of operation of steering circuit 200.

In this particular embodiment, steering circuit 200 switches between the first and second modes of operation depending on the voltage on a node 213, referred to herein as "Vnode213". When Vnode213 is below a steering threshold level, the VGS (voltage between the gate and source) of transistor 201 is too low to allow transistor 201 to conduct and flow current. In that case, steering circuit 200 will be in the first mode of operation and current will flow through circuit 207, but not through circuit 208. The opposite is true when Vnode213 is above the steering threshold voltage. In that case, the VGS of transistor 201 will be high enough to allow it to conduct, and put steering circuit 200 in the second mode operation where current flows through circuit 208, but not through circuit 207.

Transistors 201, 202, 205, and 206, in effect, form a comparator collectively depicted in FIG. 2 as comparator 219. Comparator 219 compares the a reference voltage, Vref, on a node 221, herein referred to as "Vnode221", with an input voltage, Vin, on node 213 (Vnode213) and accordingly switches steering circuit 200 between the first and second modes of operation. That is, when Vnode213 is less than Vnode221, the resulting gate-source voltage, VGS, of transistor 201 will be too low to allow current to flow, causing steering circuit 200 to be in the first mode of operation. Conversely, when Vnode213 is greater than Vnode221, the VGS of transistor 201 will be high enough to allow current flow, and steering circuit 200 will be in the second mode of operation. As can be appreciated, the level and polarity of Vnode213 at which steering circuit 200 switches modes of operation depend on the particular application. For example, with the appropriate routine design change, steering circuit 200 may be placed in the first mode of operation when Vnode213 is greater than Vnode221.

In this particular embodiment, reference voltage Vnode221 is established by employing a current source 210 to provide current through diode-connected transistor 204. The resulting voltage on the drain of transistor 204, which is Vnode221, also appears on the gate of another diode-connected transistor 205. Thus, Vnode221 sets the voltage on the gate of transistor 205, and controls the amount of current flowing through it (current 222). Transistor 202, which forms a current mirror with transistor 206, also flows an amount of current approximately equal to current 222. The current mirrored by transistor 202 from transistor 206 establishes a voltage level on the source of transistor 201 and the source of transistor 202, thereby influencing the amount of voltage on node 213 needed to make transistors 201 and 202 conduct.

As will be readily apparent to those skilled in the art, matching characteristics in transistors 201 and 205, and transistors 202 and 206 will cause current flow 216 to match current flow 222 at an operating point in which Vin is equal to Vref. The transistors can be matched by making the physical characteristics of these devices in the silicon substrate similar using any of the accepted techniques known in the art.

Other features of the circuit in FIG. 2 will now be described. Circuit 208 is an n-channel input differential amplifier, with differential input signals VINL and VIPL, and output signals VOPL and VONL. Transistors M72 and M67 form the n-channel differential pair and accept the differential input signals VINL and VIPL, respectively. Transistors M82 and M83 are used as cascode devices to control the drain to source voltages across transistors M67 and M72, respectively. Transistors M5, M25, and M30 form a current mirror to mirror the drain current of M67 to output signal VONL. Transistors M15, M28, and M29 form a current mirror to mirror the drain current of M72 to output signal VOPL. The output of the n-channel differential amplifier 208 is a differential current into the differential output VONL and VOPL. Transistors M46, M99, M48, and M47 are the biasing circuit for transistors M82 and M83. Transistors M66, M91, and transistor 218 form a current source, which provides bias current 217 to the differential amplifier 208.

Circuit 207 is a p-channel input differential amplifier, with differential input signals VINL and VIPL, and output signals VOPL and VONL. Transistors M11 and M10 form the p-channel differential input pair and accept differential input signals VINL and VIPL, respectively. Transistors M52 and M53 are used as cascode devices to control the drain to source voltages across transistors M10 and M11, respectively. The output of the p-channel input differential pair is a differential current into the differential output VONL and VOPL. Transistors M84, M89, M81, and M88 are the biasing circuit for transistors M52 and M53. Transistors 209 and M19 form a current source, which provides bias current 215 to the p-channel differential pair. Transistors M8, M58, M59, and M6 form a load circuit for the p-channel differential pair of 207 and the n-channel differential amplifier 208. The differential output currents from the p-channel differential pair of 207 and from the n-channel differential amplifier 208 are summed together at the differential output VONL and VOPL, and converted to a differential voltage VONL and VOPL by the load circuit. VOPL and VONL represent the differential output voltage of the combined p-channel amplifier 207 and n-channel amplifier 208.

FIG. 2 also includes other supporting circuitry. For example, transistors M12, M13, M32, M4, M56 and M57 form a slew enhancement circuit. The slew enhancement circuit is described in a co-pending application 10/109,633 assigned to the same assignee. M98 is a cascode transistor in series with current source 210. There are also four bias voltages depicted in FIG. 2, namely VB1L, VB1H, VSON, and VSOP. VB1L is the bias voltage for p-channel current source transistors M13, 209, and M46. VB1H is the bias voltage for n-channel current source transistors M88, 210, and M91. VSOP is the bias voltage for p-channel cascode transistors M19, M29, M47, M30, and M80. VSON is the bias voltage n-channel cascade transistors M4, M84, M66, and M98.

As described above, the specific embodiment in FIG. 2 includes a current steering circuit that directs the bias current to the n-channel amplifier 208 and p-channel amplifier 207, according to the reference voltage Vref (or Vnode221) and an input voltage Vin (or Vnode213). Both amplifiers 207 and 208 supply differential output signals VOPL and VONL to the same pair of differential output nodes. However, circuits 207 and 208 are not limited to any specific type of circuit. Similarly, the output signals of circuits 207 and 208 are not limited to differential output signals.

Figure 3:
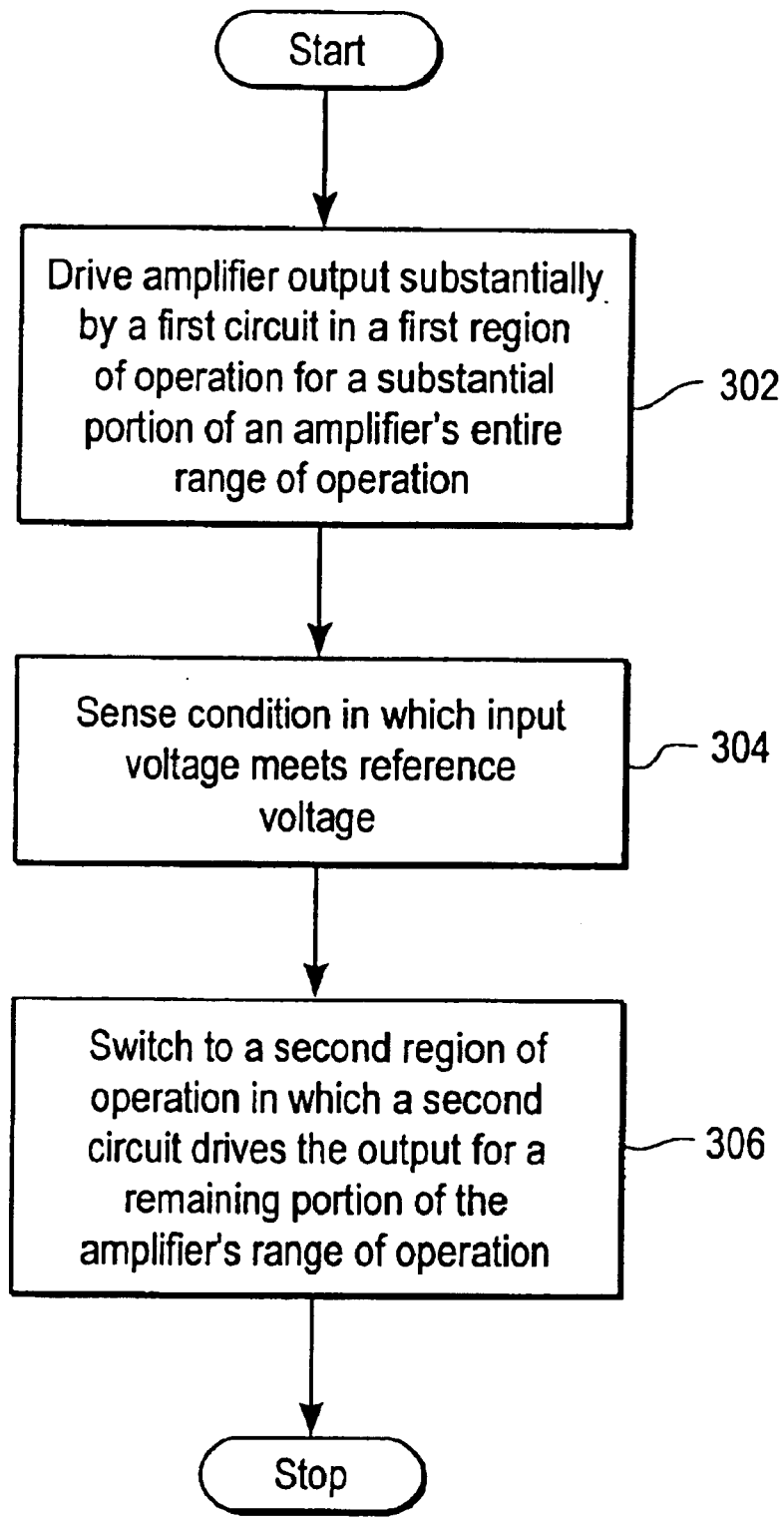
FIG. 3 illustrates a flowchart of a representative process for maintaining a substantially constant error in an output voltage in a specific embodiment of the present invention.

FIG. 3 illustrates a flowchart of a representative process for maintaining a substantially constant error in an output voltage sourced by an amplifier that comprises a first circuit and a second circuit in a specific embodiment of the present invention. Depending on embodiment, the first and second circuits can be a p-channel amplifier and an n-channel amplifier, respectively, or an n-channel amplifier and a p-channel amplifier, respectively. FIG. 3 illustrates driving the output voltage in a first region of operation substantially by a first circuit for a substantial portion of the amplifier's entire range of operation 302. Then, a condition wherein an input voltage, Vin, reaches a reference voltage, Vref, is sensed 304. Then, a switch over from the first region of operation to a second region of operation is caused 306. In the second region of operation, a second circuit substantially drives the output for a remaining portion of the amplifier's range of operation. The reference voltage, Vref, can be made sufficiently large to provide a substantially constant error within the output voltage by causing operation in the first region to occur for a substantial portion of the amplifier's entire range of operation.

In specific embodiments, the first region of operation comprises operation in which a p-channel amplifier is active and an n-channel is relatively not active, while the second region of operation comprises operation in which the n-channel amplifier is active and the p-channel is relatively not active. In other specific embodiments, the first region of operation comprises operation in which the n-channel amplifier is active and the p-channel is relatively not active, while the second region of operation comprises operation in which the p-channel amplifier is active and the n-channel is relatively not active.

Figure 4:
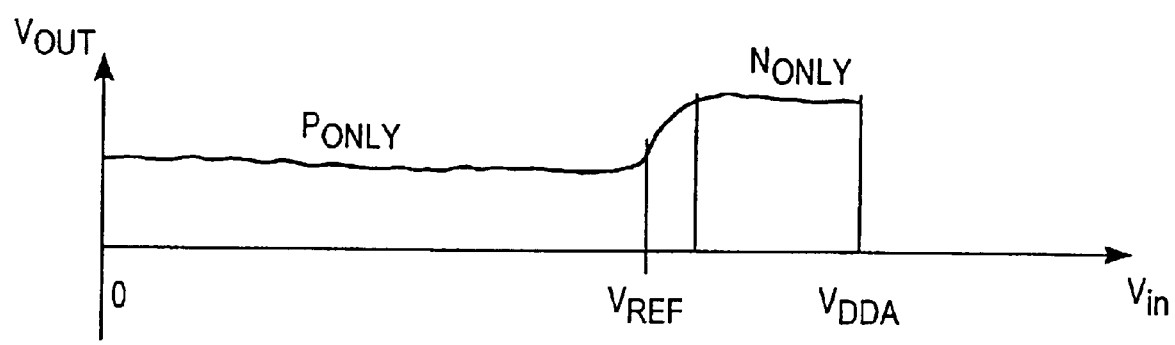
FIG. 4 illustrates a representative graph of an output voltage as a function of an input voltage for a specific embodiment of the present invention.

FIG. 4 illustrates a representative graph of an output voltage as a function of an input voltage for a specific embodiment of the present invention. FIG. 4 illustrates a graph of an output voltage, Vout, as a function of input voltage, Vin, over an entire range of operation from 0 to VDDA for a specific embodiment of the present invention. As shown by representative graph of FIG. 4, the output voltage is substantially linear over a range of operation from 0 to Vref.

The preceding has been a description of the preferred embodiment of the invention. It will be appreciated that deviations and modifications can be made without departing from the scope of the invention, which is defined by the appended claims.

What is claimed is:

1. A method for maintaining a substantially constant error in an output voltage sourced by an amplifier comprising a first circuit and a second circuit, said method comprising:

driving said output voltage in a first region of operation in each of said first circuit and said second circuit, wherein in said first region of operation, said first circuit substantially drives said output;

sensing a condition wherein Vin reaches Vref; and causing a switch over from said first region of operation to a second region of operation in each of said first circuit and said second circuit, wherein in said second region of operation, sad second circuit substantially drives said output;

wherein Vref is set to provide a substantially constant error within said output voltage.

2. The method of claim 1, wherein said first circuit is a p-channel amplifier and said second circuit is an n-channel amplifier.

3. The method of claim 2, wherein said first region of operation comprises operation wherein said p-channel amplifier is active and said n-channel is relatively not active; and said second region of operation comprises operation wherein said n-channel amplifier is active and.

4. The method of claim 1, wherein said first circuit is a n-channel amplifier and said second circuit is an p-channel amplifier.

5. The method of claim 4, wherein said first region of operation comprises operation wherein said n-channel amplifier is active and said p-channel is relatively not active; and said second region of operation comprises operation wherein said p-channel amplifier is active and said n-channel is relatively not active.

6. The method of claim 1, wherein Vref is set to provide a substantially constant error within said output voltage by making Vref sufficiently large in comparison to Vin.

7. The method of claim 1, wherein

Vref is set to provide a substantially constant error within said output voltage by making Vref sufficiently small in comprising to Vin.

8. An apparatus, comprising:

means for driving an output voltage in a first region of operation in each of a first circuit and a second circuit;

means for sensing a condition wherein an input voltage (Vin) reaches a reference voltage (Vref);

means for switching over from a first region of operation to a second region of operation in each of said first circuit and said second circuit; and means for setting Vref to be sufficiently large, thereby maintaining a substantially constant error in said output voltage.

9. A method, comprising:

driving an output voltage in a first region of operation substantially by a first circuit for a substantial portion of an amplifier's entire range of operation;

sensing a condition wherein an input voltage, Vin, reaches a reference voltage, Vref; and switching over from the first region of operation to a second region of operation;

wherein a second circuit substantially drives the output voltage for a remaining portion of the amplifier's range of operation; and wherein the reference voltage, Vref, is made sufficiently large to provide a substantially constant error within the output voltage by causing operation in the first region to occur for a substantial portion of the amplifier's entire range of operation.

* * * * *